US006599674B1

(12) United States Patent
Kawamura

(10) Patent No.: US 6,599,674 B1
(45) Date of Patent: *Jul. 29, 2003

(54) HEAT-SENSITIVE LITHOGRAPHIC PRINTING PLATE

(75) Inventor: Koichi Kawamura, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/507,675

(22) Filed: Feb. 22, 2000

(30) Foreign Application Priority Data

Feb. 22, 1999 (JP) ...................................... P. 11-042590

(51) Int. Cl.[7] ............................................... G03F 7/038

(52) U.S. Cl. ................................ 430/270.1; 430/281.1; 430/286.1; 430/944; 430/945; 101/453

(58) Field of Search ........................... 430/270.1, 281.1, 430/286.1, 302, 303, 944, 945; 101/453

(56) References Cited

U.S. PATENT DOCUMENTS

| | | | | | |
|---|---|---|---|---|---|
| 4,034,183 | A | * | 7/1977 | Uhlig | 219/122 |
| 4,081,572 | A | * | 3/1978 | Pacansky | 427/53 |
| 4,634,659 | A | * | 1/1987 | Esumi et al. | 430/302 |
| 4,693,958 | A | * | 9/1987 | Schwartz et al. | 430/302 |
| 5,512,418 | A | * | 4/1996 | Ma | 430/271.1 |
| 5,698,369 | A | * | 12/1997 | Kawamura et al. | 430/281.1 |
| 5,731,123 | A | * | 3/1998 | Kawamura et al. | 430/176 |
| 5,922,512 | A | * | 7/1999 | DoMinh | 430/302 |
| 5,985,514 | A | * | 11/1999 | Zheng et al. | 430/270.1 |
| 6,017,677 | A | | 1/2000 | Maemoto et al. | 430/270.1 |
| 6,096,471 | A | * | 8/2000 | Van Damme et al. | 430/188 |
| 6,114,083 | A | * | 9/2000 | Kawamura et al. | 430/270.1 |
| 6,136,503 | A | * | 10/2000 | Zheng et al. | 430/270.1 |
| 6,146,812 | A | * | 11/2000 | Leon et al. | 430/270.1 |
| 6,153,352 | A | * | 11/2000 | Oohashi et al. | 430/270.1 |
| 6,159,657 | A | * | 12/2000 | Fleming et al. | 430/270.1 |
| 6,162,578 | A | * | 12/2000 | Zheng et al. | 430/270.1 |
| 6,165,679 | A | * | 12/2000 | Van Damme et al. | 430/270.1 |
| 6,165,691 | A | * | 12/2000 | Damme et al. | 430/303 |
| 6,177,230 | B1 | * | 1/2001 | Kawamura | 430/270.1 |
| 6,190,830 | B1 | * | 2/2001 | Leon et al. | 430/270.1 |
| 6,190,831 | B1 | * | 2/2001 | Leon et al. | 430/270.1 |
| 6,214,515 | B1 | * | 4/2001 | Van Damme et al. | 430/188 |
| 6,399,268 | B1 | * | 6/2002 | Fleming et al. | 430/270.1 |
| 6,410,202 | B1 | * | 6/2002 | Fleming et al. | 430/270.1 |
| 6,413,694 | B1 | * | 7/2002 | Zheng et al. | 430/270.1 |
| 6,423,469 | B1 | * | 7/2002 | DoMinh et al. | 430/270.1 |

FOREIGN PATENT DOCUMENTS

| | | | | |
|---|---|---|---|---|
| EP | 0573091 | A1 | | 12/1993 |
| EP | 652 483 | A1 | * | 5/1995 |
| EP | 0802067 | A1 | | 10/1997 |
| EP | 903224 | | | 3/1999 |
| JP | A 10-282672 | | | 10/1998 |
| JP | A 11-084658 | | | 3/1999 |

OTHER PUBLICATIONS

Patent Abstracts of Japan, vol. 1997, No. 07, Jul. 31, 1997, & JP 09 058143 A, (Konica Corp.), Mar. 4, 1997, *Abstract Only*.

* cited by examiner

*Primary Examiner*—Janet Baxter
*Assistant Examiner*—Barbara Gilliam
(74) *Attorney, Agent, or Firm*—Burns, Doane, Swecker & Mathis, LLP

(57) ABSTRACT

The present invention can provide a heat-sensitive lithographic printing plate which can be subjected to aqueous development or does not require any special treatment such as wet development and rubbing after image writing, in particular, a heat-sensitive lithographic printing plate which can be subjected to recording by a solid laser or semiconductor laser emitting infrared rays to allow direct plate making from digital data. Furthermore, the present invention can provide a heat-sensitive lithographic printing plate excellent in press life. The heat-sensitive lithographic printing plate comprises an image-forming layer containing a polymer which is capable of changing its hydrophilicity by heat and is crosslinked by crosslinking reaction.

2 Claims, No Drawings

HEAT-SENSITIVE LITHOGRAPHIC PRINTING PLATE

FIELD OF THE INVENTION

The present invention relates to a heat-sensitive lithographic printing plate which can be used as a lithographic printing plate precursor (hereinafter occasionally referred to as "PS plate"). More particularly, the present invention relates to a heat-sensitive lithographic printing plate which can be subjected to treatment by various lasers emitting visible light or infrared rays according to digital signal to allow direct plate making, can be subjected to aqueous development or can be directly mounted on the printing machine for printing, and in particular, a heat-sensitive lithographic printing plate adapted for production of printing plate requiring no treatment.

BACKGROUND OF THE INVENTION

Heretofore, the production of a printing plate from a PS plate includes, steps subsequent to an exposure step, for example, a wet development step for imagewise removing a photosensitive layer (image-forming layer) formed on the surface of a support, and post-treatment steps such as washing of the developed printing plate with a rinsing liquid, and the treatment-of the developed printing plate with a rinsing solution containing a surface active agent or a desensitizing solution containing gum arabic and a starch derivative.

In recent years, on the other hand, the waste liquid from the development step has caused environmental problem in the printing industry because it is alkaline. Further, the plate making procedure is under rationalization. It has thus been desired to provide a printing plate precursor which does not require the foregoing complicated wet development and thus can be immediately used for printing after exposure.

Radiation-sensitive image-forming materials adapted for the production of positive-working lithographic printing plate requiring no treatment are described in JP-A-7-186562 (The term "JP-A" as used herein means an "unexamined published Japanese patent application"). The above cited patent discloses a compound containing a functional group having a specific carboxylic acid ester structure which changes from hydrophobic to hydrophilic when acted upon by heat or acid. The use of such a compound allows printing without development after exposure, to obtain satisfactory printed matter. However, it has been desired to further improve the press life of such a lithographic printing plate.

SUMMARY OF THE INVENTION

It is therefore an object of the present invention to provide a radiation-sensitive lithographic printing plate which can be subjected to aqueous development or does not require any special treatment such as wet development and rubbing after image writing, particularly a heat-sensitive lithographic printing plate which can be subjected to recording by a solid laser or semiconductor laser emitting infrared rays to allow direct plate making from digital data.

It is another object of the present invention to provide a heat-sensitive lithographic printing plate excellent in press life.

These and other objects of the present invention will become apparent from the following detailed description and examples.

The inventors made extensive studies of the foregoing problems. As a result, it was found that the foregoing objects of the present invention can be solved with a novel heat-sensitive lithographic printing plate comprising an image-forming layer containing a polymer which is capable of changing its hydrophilicity by heat and is one crosslinked by crosslinking reaction.

The heat-sensitive lithographic printing plate according to the present invention comprises a characteristic polymer incorporated in its image-forming layer to provide the image-forming layer with an enhanced film strength.

The heat-sensitive lithographic printing plate according to the present invention allows the foregoing polymer to undergo imagewise change in its hydrophilicity when acted upon by heat from a predetermined heating means or an acid generated by a predetermined acid generating means, allowing printing without development treatment for the formation of an image and hence making it possible to obtain a satisfactory printed matter. The heat-sensitive lithographic printing plate according to the present invention is also excellent in press life. The crosslinked polymer is preferably one crosslinked by photo-crosslinking reaction without being heated, since it is more effective for the protection of a functional group which changes in its hydrophilicity when acted upon by heat.

DETAILED DESCRIPTION OF THE INVENTION

The polymer to be incorporated in the image-forming layer of the heat-sensitive lithographic printing plate of the present invention is not specifically limited so far as it is capable of changing its hydrophilicity when acted upon by heat and is crosslinked.

The change in hydrophilicity may be from hydrophobicity to hydrophilicity or vice versa.

If the former change occurs, the heat-sensitive lithographic printing plate of the present invention is positive-working. On the contrary, if the latter change occurs, the heat-sensitive lithographic printing plate of the present invention is negative-working.

The foregoing change in the hydrophilicity of the polymer is preferably attained by allowing the polymer to have in its side chain the group which change in its hydrophilicity when acted upon by heat.

Examples of the group which changes from hydrophobic to hydrophilic when acted upon by heat will be further described with reference to at least one functional group selected from the group consisting of sulfonic acid ester group, disulfone group, sulfonimide group and alkoxyalkylester group.

Sulfonic acid ester group, disulfone group and sulfonimide group can be represented by the following general formulae (1), (2) and (3), respectively.

$$—L—SO_2—O—R^1 \quad (1)$$

$$—L—SO_2—SO_2—R^2 \quad (2)$$

$$—L—SO_2—N(R^4)—SO_2—R^3 \quad (3)$$

wherein L represents an organic group composed of polyvalent nonmetallic atoms required for connecting the functional group represented by the general formula (1), (2) or (3) to the polymer skeleton; and $R^1$, $R^2$, $R^3$ and $R^4$each represent a substituted or unsubstituted aryl group, substituted or unsubstituted alkyl group or cyclic imide group.

The substituted or unsubstituted aryl group represented by $R^1$, $R^2$, $R^3$ or $R^4$ may be carbocyclic or heterocyclic. As the carbocyclic aryl group there may be used a $C_{6-19}$ carbocyclic aryl group such as phenyl group, naphthyl group, anthracenyl group and pyrenyl group. As the heterocyclic aryl group there may be used a heterocyclic aryl group having from 3 to 20 carbon atoms and from 1 to 5 heteroatoms such as pyridyl group, furyl group and other heterocyclic groups obtained by the condensation of benzene rings, e.g., quinolyl, benzofuryl, thioxanthone and carbazole. The substituted or unsubstituted alkyl group represented by $R^1$, $R^2$, $R^3$ or $R^4$ may be a straight-chain, branched or cyclic alkyl group having from 1 to 25 carbon atoms such as methyl group, ethyl group, isopropyl group, t-butyl group and cyclohexyl group.

Examples of the substituents on the substituted aryl, heteroaryl or alkyl group represented by $R^1$, $R^2$, $R^3$ or $R^4$ include $C_{1-10}$ alkoxy group such as methoxy group and ethoxy group, halogen atom such as fluorine atom, chlorine atom and bromine atom, halogen-substituted alkyl group such as trifluoromethyl group and trichloromethyl group, $C_{2-15}$ alkoxycarbonyl or aryloxycarbonyl group such as methoxycarbonyl group, ethoxycarbonyl group, t-butyloxycarbonyl group and p-chlorophenyloxycarbonyl group, hydroxyl group, acyloxy group such as acetyloxy group, benzoyloxy group and p-diphenylaminobenzoyloxy group, carbonate group such as t-butyloxycarbonyloxy group, ether group such as t-butyloxycarbonylmethyloxy group and 2-pyranyloxy group, substituted or unsubstituted amino group such as amino group, dimethylamino group, diphenylamino group, morpholino group and acetylamino group, thioether group such as methylthio group and phenylthio group, alkenyl group such as vinyl group and styryl group, nitro group, cyano group, acyl group such as formyl group, acetyl group and benzoyl group, aryl group such as phenyl group and naphthyl group, and heteroaryl group such as pyridyl group. As the substituent on the substituted or unsubstituted aryl or heteroaryl group represented by $R^1$, $R^2$, $R^3$ or $R^4$ there may be used an alkyl group such as methyl and ethyl besides the foregoing substituents.

Examples of the cyclic imide group represented by $R^1$, $R^2$, $R^3$ or $R^4$include $C_{4-20}$ cyclic imides such as succinic acid imide, phthalic acid imide, cyclohexanedicarboxylic acid imide and norbornenedicarboxylic acid imide.

Particularly preferred among the groups represented by $R^1$, $R^2$, $R^3$ and $R^4$ are an aryl group substituted by electron-withdrawing group such as halogen, cyano and nitro, an alkyl group substituted by electron-withdrawing group such as halogen, cyano and nitro, a secondary or tertiary branched alkyl group, a cyclic alkyl group and a cyclic imide group.

The polyvalent connecting group composed of nonmetallic atoms represented by L is formed by from 1 to 60 carbon atoms, from 0 to 10 nitrogen atoms, from 0 to 50 oxygen atoms, from 1 to 100 hydrogen atoms and from 0 to 20 sulfur atoms. Specific examples of these connecting groups include those formed by the combination of the following structural units:

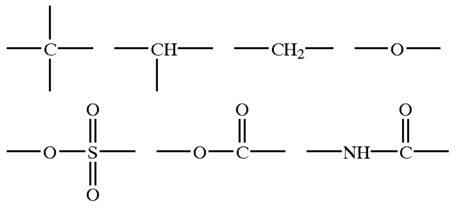

-continued

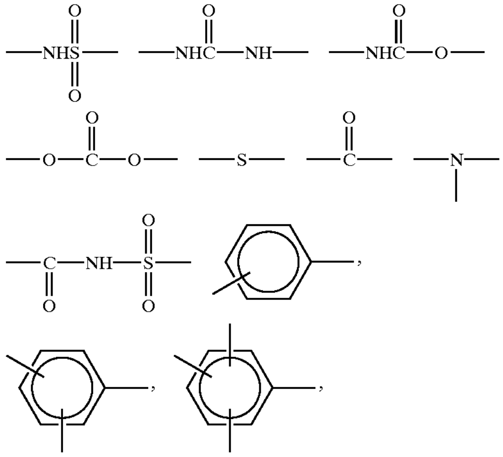

polyvalent naphthalene, and polyvalent anthracene.

Examples of the substituent on the polyvalent connecting group, if substituted, include a $C_{1-20}$ alkyl group such as methyl and ethyl, a $C_{6-16}$ aryl group such as phenyl and naphthyl, a $C_{1-6}$ acyloxy group such as acetoxy, a hydroxyl group, a carboxyl group, a sulfonamide group, a N-sulfonylamide group and a $C_{1-6}$ alkoxy group such as methoxy and ethoxy, a halogen atom such as chlorine and bromine, a $C_{2-7}$ alkoxycarbonyl group such as methoxycarbonyl, ethoxycarbonyl and cyclohexyloxycarbonyl, a cyano group, and a carboxylic acid ester group such as t-butyl carbonate.

The alkoxyalkylester group can be represented by the following general formula (4).

(4)

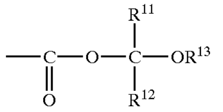

In the foregoing general formula (4), $R^{11}$ represents a hydrogen atom, $R^{12}$ represents a hydrogen atom or an alkyl group having 18 or less carbon atoms, and $R^{13}$ represents an alkyl group having 18 or less carbon atoms. Two of $R^{11}$, $R^{12}$ and $R^{13}$ may be connected to each other to form a ring. In particular, it is preferred that $R^{12}$ and $R^{13}$ be connected to each other to form a 5- or 6-membered ring.

As the functional group there can be used one represented by the foregoing general formula (1), (2), (3) or (4). Preferred among these functional groups are sulfonic acid ester group represented by the general formula (1) and alkoxyalkylester group represented by the general formula (4). Particularly preferred among these functional groups is sulfonic acid ester group represented by the general formula (1). Specific examples of the functional groups represented by the general formulae (1) to (4) will be given below.

(1)

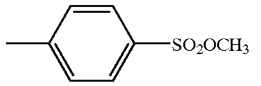

-continued (2)

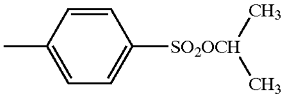

(3)

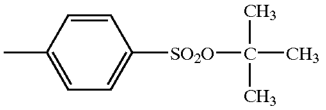

(4)

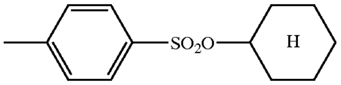

(5)

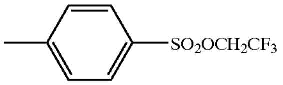

(6)

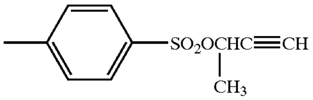

(7)

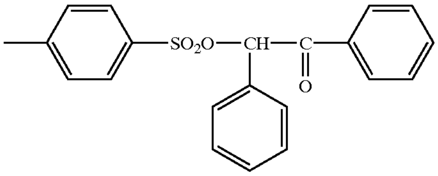

(8)

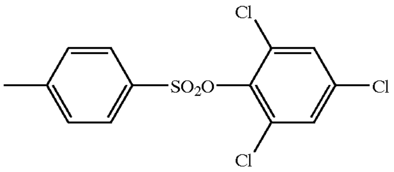

(9)

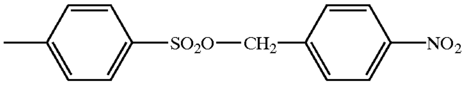

(10)

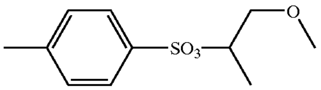

(11)

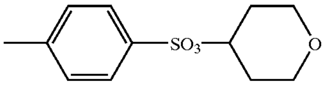

(12)

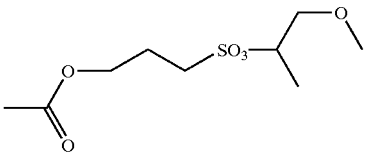

(13)

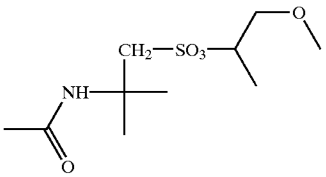

-continued (14)

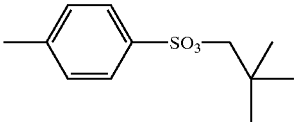

(15)

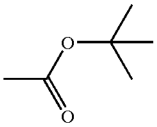

(16)

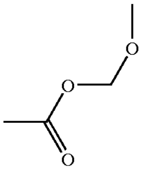

(17)

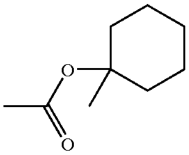

(18)

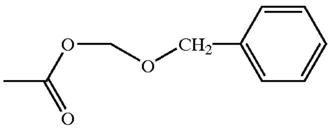

The foregoing functional group acts to allow the foregoing polymer to change from hydrophobic to hydrophilic when acted upon by heat or acid. In particular, such a functional group preferably acts to reduce the contact angle of the polymer with respect to water drop in the air by not less than 15°. In other words, the foregoing polymer preferably reduces its contact angle with respect to water drop in the air by not less than 15°, more preferably not less than 40° when acted upon by heat or acid to change from hydrophobic to hydrophilic. Even more preferably, the foregoing polymer initially has a contact angle of not less than 60° with respect to water drop in the air but reduces the contact angle to not higher than 200 when acted upon by heat or acid.

Among the groups which change in the hydrophilicity due to heat, groups which are hydrophilic but become hydrophobic by heat are described below by referring to specific examples thereof. Specific examples thereof include a carboxylic acid group, a carboxylate group, a sulfonic acid group and a phosphonic acid group, and at least one functional group is selected from these.

The carboxylic acid, the carboxylate group, a sulfonic acid group and the phosphonic acid group can be represented by the following formulae (5), (6), (7) and (8), respectively:

Formula (5)

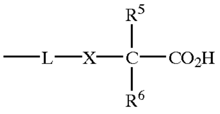

-continued

Formula (6)

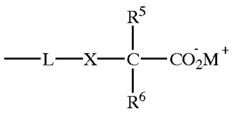

Formula (7)

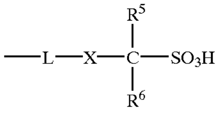

Formula (8)

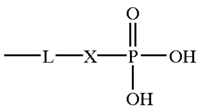

wherein X is selected from the group consisting of —CO—, —SO—, —$SO_2$— and elements belonging to Groups VA (e.g., N) to VIA (e.g. O and S), with the proviso that the element belonging Group VA forms a divalent group with a hydrogen atom or a substituent, L represents a polyvalent organic group composed of nonmetallic atoms necessary for linking the functional group represented by formula (5), (6), (7) or (8) to a polymer skeleton, $R^5$ and $R^6$, which may be the same or different, each represents hydrogen, a substituted or unsubstituted aryl group or a substituted or unsubstituted alkyl group, and M is selected from the group consisting of alkali metals, alkaline earth metals and oniums.

Among these, preferred are the carboxylic acid group, the carboxylate group and the sulfonic acid group represented by formulae (5), (6) and (7), respectively, more preferred is the carboxylate group represented by formula (6). Specific examples of the functional groups represented by formulae (5) to (8) are described below.

(19)

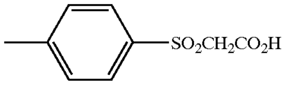

(20)

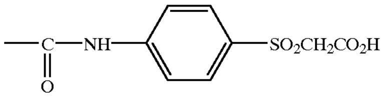

(21)

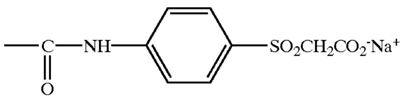

(22)

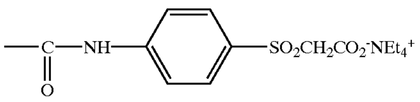

(23)

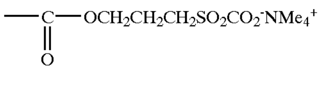

(24)

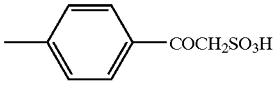

In the preparation of the polymer according to the present invention, the molar ratio of the monomer having a group which changes in the hydrophilicity with heat to the monomer having a crosslinkable functional group is generally from 97:3 to 10:90, preferably from 95:5 to 30:70, more preferably from 95:5 to 40:60.

Further, the polymer to be incorporated in the image-forming layer of the heat-sensitive lithographic printing plate of the present invention not only changes in its hydrophilicity when acted upon by heat but also has a crosslinked structure developed by crosslinking reaction such as photo-crosslinking, sol-gel crosslinking and heat crosslinking. The photo-crosslinking is preferable to the sol-gel crosslinking and heat crosslinking, since the functional group which changes in its hydrophilicity with heat is free from influence of an acid or alkali catalyst and heat. The polymer before subjected to crosslinking has generally from 3,000 to 500,000, preferably from 5,000 to 500,000, more preferably from 5,000 to 300,000.

The polymer crosslinked by photo-crosslinking reaction will be further described hereinafter.

Photo-crosslinking can be accomplished by photodimerization or photoradical polymerization. The polymer comprises a crosslinking reactive group incorporated therein so that it can react by itself or with a monomer to undergo crosslinking.

In the photodimerization reaction, the polymer absorbs irradiated light by its functional group or through a photosensitizer incorporated therein to undergo crosslinking reaction.

In the photoradical crosslinking reaction, the polymer is irradiated with light with a well-known photopolymerization initiator incorporated therein to undergo crosslinking reaction.

The polymer which undergoes crosslinking upon photo-crosslinking reaction can be obtained by the copolymerization of a monomer having a photo-crosslinkable functional group, i.e., photosetting functional group with a monomer having a group which changes in its hydrophilicity when acted upon by heat.

The term "photosetting functional group" as used herein is meant to indicate a functional group which allows a resin to undergo curing reaction when acted upon by light.

As the photosetting functional group there may be used one for use in known photosensitive resins such as photosetting resins cited in general remarks, e.g., Hideo Inui and Gentaro Nagamatsu, "Kankouseikoubunshi (Photosensitive High Molecular Compounds", Kodansha, 1977, Takahiro Tsunoda, "Shin Kankouseijyusi (New Photosensitive Resins)", Publishing Department, The Japanese Society of Printing Science and Technology, 1981, G. E. Green and B. P. Strak, J. Macro. Sci. Reas. Macro. Chem., C21(2), 187–273 (1981–1982), C. G. Rattey, "Photopolymerization of Surface Coatings", A. Wiley Inter Science Pub., 1982.

Examples of such a functional group include polymerizable double bond group and photo-crosslinkable double bond group.

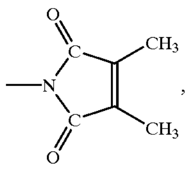 , 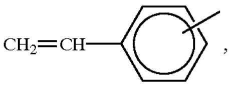 ,

Specific examples of the polymerizable double bond group include $CH_2$=CH—, $CH_2$=$CHCH_2$—, $CH_2$=CHCOO—, $CH_2$=C($CH_3$)COO—, C($CH_3$)H=CHCOO—, $CH_2$=CHCONH—, $CH_2$=C($CH_3$)CONH—, C($CH_3$)H=CHCONH—, $CH_2$=CHOCO—, $CH_2$=C($CH_3$)OCO—, $CH_2$=$CHCH_2$OCO—, $CH_2$=CHNHCO—, $CH_2$=$CHCH_2$NHCO—, $CH_2$=$CHSO_2$—, $CH_2$=CHCO—, $CH_2$=CHO—, and $CH_2$=CHS—.

Specific examples of the photo-crosslinkable double bond group include —CH=CH—, and $-C(CH_3)=C(CH_3)-$.

A particularly preferred example of the photo-crosslinkable double bond group is a maleimide group represented by the following general formula (A).

(A)

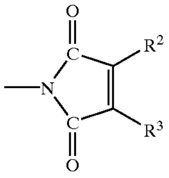

wherein $R^2$ and $R^3$ each represent a hydrogen atom, halogen atom or alkyl group, with the proviso that $R^2$ and $R^3$ may combine to form a 5- or 6-membered ring.

The alkyl group represented by $R^2$ or $R^3$ is preferably a $C_1$ alkyl group, particularly methyl group. Further, it is preferred that $R^2$ and $R^3$ combine to form a 6-membered ring. The halogen atom represented by $R^2$ or $R^3$ is preferably a chlorine atom, bromine atom or iodine atom.

Specific examples of the foregoing maleimide group are disclosed in JP-A-52-988 (corresponding to U.S. Pat. No. 4,079,041), West German Patent 2,626,769, European Patent 21,019, European Patent 3,552, "Die Angewandte Mackromolekurare Chemi", 115 (1983), pp. 163–181, JP-A-49-128991, JP-A-49-128992, JP-A-49-128993, JP-A-50-5376, JP-A-50-5377, JP-A-50-5378, JP-A-50-5379, JP-A-50-5380, JP-A-53-5298, JP-A-53-5299, JP-A-53-5300, JP-A-50-50107, JP-A-51-47940, JP-A-52-13907, JP-A-50-45076, JP-A-52-121700, JP-A-50-10884, JP-A-50-45087, JP-A-58-43951, West German Patents 2,349,948 and 2,616,276.

In the present invention, among these monomers, those represented by the following general formulae (B) to (D) can be used.

(B)

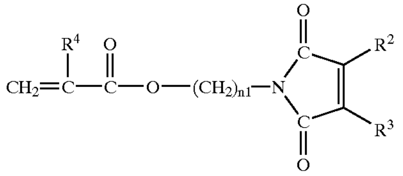

(C)

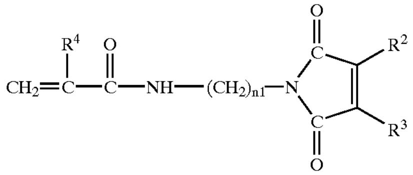

(D)

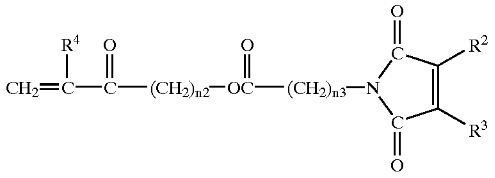

wherein $R^2$ and $R^3$ are as defined in the general formula (A); $R^4$ represents a hydrogen atom or methyl group; and $n_1$, $n_2$ and $n_3$ each represent an integer, preferably from 1 to 6.

The monomer which can be used in the foregoing photoradical polymerization crosslinking is a compound containing a addition-polymerizable double bond. More particularly, such a monomer can be arbitrarily selected from the group consisting of compounds having at least one, preferably two or more ethylenically unsaturated bonds on the terminal(s).

These monomers may be in any chemical form such as monomer, prepolymer, i.e., dimer, trimer, oligomer, a mixture thereof, and a copolymer thereof.

Examples of these monomers and copolymers thereof include ester of unsaturated carboxylic acid (e.g., acrylic acid, methacrylic acid, itaconic acid, crotonic acid, isocrotonic acid, maleic acid) with aliphatic polyvalent alcohol compound, and amide of unsaturated carboxylic acid with aliphatic polyvalent amine compound.

Specific examples of the ester of unsaturated carboxylic acid with aliphatic polyvalent alcohol as the useful monomer include acrylic acid ester such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, tetramethylolmethane tetraacrylate and polyester acrylate oligomer, methacrylic acid ester such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy)phenyl]dimethylmethane and bis-[p-(methacryloxyethoxy) phenyl]dimethylmethane, itaconic acid ester such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate, crotonic acid ester such as ethylene glycol dicrotonate, tetramethylene glycol dicrotonate, pentaerythritol dicrotonate and sorbitol tetradicrotonate, isocrotonic acid ester such as ethylene glycol diisocrotonate, pentaerythritol diisocrotonate and sorbitol tetraisocrotonate, and maleic acid ester such as ethylene glycol dimalate, triethylene glycol dimaleate, pentaerythritol dimalate and sorbitol tetramaleate. Mixtures of the foregoing ester monomers may be used.

Specific examples of the amide of aliphatic polyvalent amine compound with unsaturated carboxylic acid as the useful monomer include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, and xylylene bismethacrylamide.

Other examples of the monomer include a vinylurethane compound having two or more polymerizable vinyl groups per molecule obtained by adding a vinyl monomer containing a hydroxyl group represented by the following general formula (E) to a polyisocyanate compound having two or more isocyanate groups per molecule as described in JP-B-48-41708 (The term “JP-B” as used herein means an “examined Japanese patent application”).

$$CH_2{=}C(R_5)COOCH_2CH(R_6)OH \qquad (E)$$

wherein $R_5$ and $R_6$ each represent H or $CH_3$.

Further examples of the monomer include polyfunctional acrylates or methacrylates such as urethane acrylate as disclosed in JP-A-51-37193, polyester acrylate as disclosed in JP-A-48-64183, JP-B-49-43191 and JP-B-52-30490 and epoxy acrylate obtained by the reaction of epoxy resin with (meth) acrylic acid. Moreover, compounds cited as photosetting monomer and oligomer in “Journal of the Adhesion Society of Japan”, vol. 20, No. 7, pp. 300–308, 1984 may be used. The amount of such a compound to be used is generally from 5 to 70% by weight (hereinafter abbreviated as “%”), preferably from 10 to 50% based on the total weight of the components.

As the photopolymerization initiator to be incorporated in the photopolymerizable image-forming layer (composition) of the present invention there can be properly used any photopolymerization initiator known in patents and references or a combination of photopolymerization initiators (photopolymerization initiation system) depending on the wavelength of the light used.

For example, if a light source emitting light having a wavelength in the vicinity of 400 nm is used, benzyl, benzoin ether, Michler’s ketone, anthraquinone, thioxanthone, acridine, phenazine, benzophenone, etc. are widely used.

As the foregoing photosensitizer there can be used a photodimerization type sensitizer as described in EP 591786 and A. Reiser, “Photoreactive polymers”, Wiley Interscience, 1989.

Examples of the polymer obtained by photo-crosslinking will be given below.

KP-1

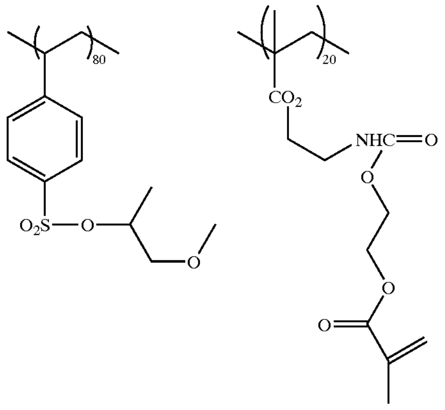

-continued

KP-2

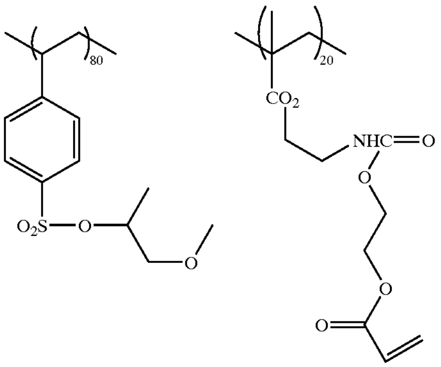

KP-3

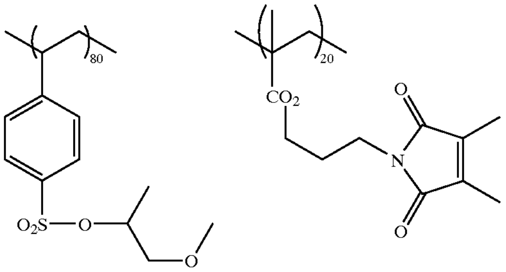

KP-4

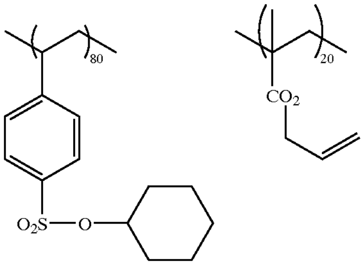

KP-5

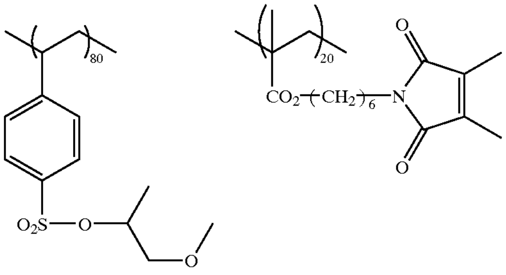

KP-6

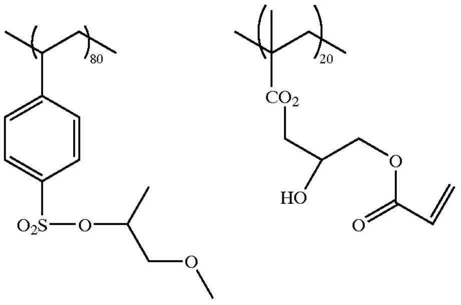

-continued

KP-7

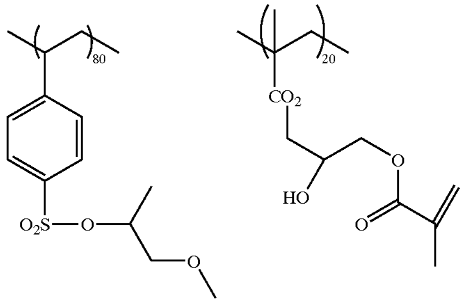

KP-8

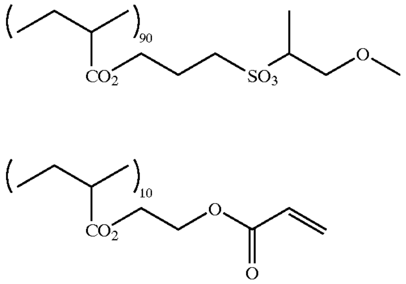

KP-9

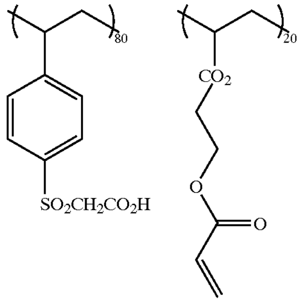

KP-10

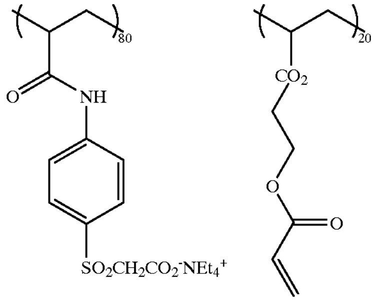

KP-11

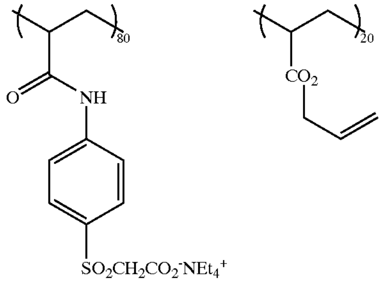

-continued

KP-12

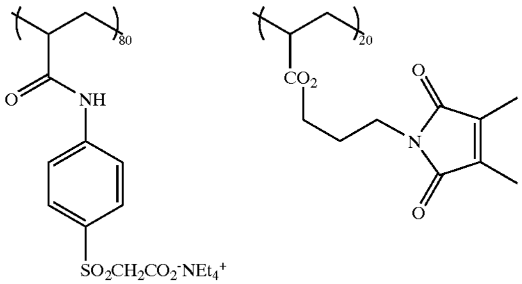

KP-13

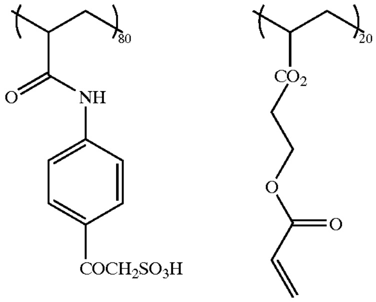

Examples of the synthesis of the crosslinked polymer to be used in the present invention will be given below.

Synthesis of Polymer KP-3

Into a three-necked flask were charged 0.4 mols of styrenesulfonic acid-1-methyl-2-methoxyethylester, 0.1 mols of N-[(3-methacroyloxy)propyl]-2,3-dimethylmaleimide and 203 g of methyl ethyl ketone. To the mixture was then added 2.44 g of azobisdimethyl valeronitrile at a temperature of 65° C. in a stream of nitrogen. At the same temperature, the mixture was then stirred for 5 hours. Methyl ethyl ketone was then distilled off under reduced pressure to obtain a solid matter. As a result of GPC (polystyrene as standard), the polymer was found to have an average molecular weight of 25,000.

Synthesis of Polymers KP-4 and 5

The synthesis procedure of polymer KP-3 was followed except that allylmethacrylic acid or N-[(6-methacroyloxy) hexyl]-2,3-dimethylmaleimide was used instead of N-[(3-methacroyloxy)propyl]-2,3-dimethylmaleimide. For the polymer KP-4, cyclohexyl styrenesulfonate was used as styrenesulfonic acid ester. The polymer KP-4 had an average molecular weight of 56,000, and the polymer KP-5 had an average molecular weight of 19,000.

Synthesis of Polymers KP-1

The synthesis procedure of polymer KP-3 was followed except that 2-methacrylo-oxyethyl isocyanate was used instead of N-[(3-methacroyloxy)propyl]-2,3-dimethylmaleimide. To the reaction solution was then added acrylic acid (0.1 mols). The mixture was then heated with stirring for 8 hours. After the reaction, methyl ethyl ketone was distilled off under reduced pressure to obtain a solid matter. As a result of GPC (polystyrene as standard), the polymer was found to have an average molecular weight of 23,000.

Synthesis of Polymer KP-2

The synthesis procedure of polymer KP-1 was followed except that methacrylic acid was used instead of acrylic acid. The resulting polymer had an average molecular weight of 23,000.

Synthesis of Polymer KP-8

Into a three-necked flask, [(3-acryloyloxypropane)-sulfonic acid]-1-methyl-2-methoxyethyl ester (0.4 mol), acrylic acid-2-[(6-chloropropioxy)ethyl]ester (0.1 mol) and 254 g of methanol were charged. Thereto, 2.44 g of azobisdimethylvaleronitrile was added at 64° C. in a nitrogen stream. The mixture was stirred at the same temperature for 5 hours and then cooled to room temperature. After the cooling, triethylamine (0.1 mol) was added dropwise and the resulting mixture was stirred for 6 hours and then poured into a large amount of water to obtain a solid. By GPC (polystyrene basis), this solid was found to be a polymer having an average molecular weight of 25,000.

Synthesis of Polymer KP-9

Into a three-necked flask, styrenesulfonylacetic acid (0.4 mol), acrylic acid-2-[(6-chloropropioxy)ethyl]ester (0.1 mol) and 222 g of methanol were charged. Thereto, 2.44 g of azobisdimethylvaleronitrile was added at 64° C. in a nitrogen stream. The mixture was stirred at the same temperature for 5 hours and then cooled to room temperature. After the cooling, triethylamine (0.1 mol) was added dropwise and the resulting mixture was stirred for 6 hours and then poured into a large amount of water to obtain a solid. By GPC (polystyrene basis), this solid was found to be a polymer having an average molecular weight of 25,000.

Synthesis of Polymers KP-10 and KP-13

Polymers KP-10 and KP-13 were synthesized in the same manner as in the synthesis of Polymer KP-8 except for using respective monomers in place of the styrenesulfonylacetic acid. By GPC (polystyrene basis), the average molecular weight of Polymer KP-10 was 35,000 and the average molecular weight of Polymer KP-13 was 30,000.

Synthesis of Polymer KP-12

Into a three-necked flask, acrylamidobenzenesulfonylacetic acid tetraethylammonium salt (0.4 mol), N-[(3-methacroyloxy)propyl]-2,3-dimethylmaleimide (0.1 mol) and 355 g of methanol were charged. Thereto, 2.44 g of azobisdimethylvaleronitrile was added at 64° C. in a nitrogen stream. The mixture was stirred at the same temperature for 5 hours and then the methanol was distilled off under reduced pressure to obtain a solid. By GPC (polystyrene basis), this solid was found to be a polymer having an average molecular weight of 25,000.

Synthesis of Polymer KP-11

Polymer KP-11 was synthesized in the same manner as in the synthesis of Polymer KP-12 except for using acrylmethacrylic acid in place of the N-[(3-methacroyloxy)propyl]-2,3-dimethylmaleimide. By GPC (polystyrene basis), the average molecular weight was found to be 40,000.

Other than those obtained by the photo-crosslinking reaction, crosslinked polymers obtained by a sol-gel reaction or heat-crosslinking reaction are described below.

The polymer obtained by a sol-gel reaction is a reaction product of (i) a compound having within the same molecule (a) at least one functional group selected from a carboxylic acid group, a carboxylate group, a sulfonic acid group and a phosphonic acid group represented by the following formulae (5), (6), (7) and (8), respectively, and (b) at least one functional group selected from the group consisting of —OH, $—NH_2$, —NH—CO—$R^7$, —Si $(OR^8)_3$, wherein $R^7$ and $R^8$ each represents an alkyl group and when $R^7$ and $R^8$ both are present in the compound having the functional groups, $R^7$ and $R^8$ may be the same or different, with (ii) a hydrolysis polymerizable compound represented by the following formula (9):

Formula (5)

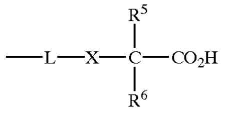

Formula (6)

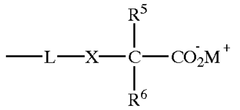

Formula (7)

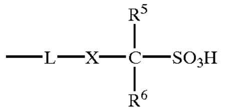

Formula (8)

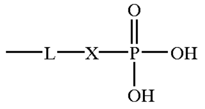

wherein X is selected from the group consisting of —CO—, —SO—, $—SO_2—$ and elements belonging to Groups VA (e.g., N) to VIA (e.g., O and S), with the proviso that the element belonging Group VA forms a divalent group with a hydrogen atom or a substituent, L represents a polyvalent organic group composed of nonmetallic atoms necessary for linking the functional group represented by formula (5), (6), (7) or (8) to a polymer skeleton, $R^5$ and $R^6$ which may be the same or different, each represents a monovalent group, and M represents any one selected from the group consisting of alkali metals, alkaline earth metals and oniums;

$$(R^9)_n—X^1—(OR^{10})_{4-n}$$ Formula (9)

wherein $R^9$ and $R^{10}$, which may be the same or different, each represents an alkyl group or an aryl group, $X^1$ represents Si, Al, Ti or Zr, and n represents 0, 1 or 2.

In the compound (i), the functional group (a) which is hydrophilic but becomes hydrophobic by the action of heat undertakes the function of responding to image signals and directly responds to heat and turns hydrophobic, thereby recording the image signal within the molecule. The functional group (b) present in the same molecule has a function of connecting the compound (i) to the matrix in the periphery. More specifically, the functional group (b) reacts with at least either one of the hydrolysis polymerizable compound (ii) represented by formula (9) or a hydrolysis product thereof, and at the same time, accompanying the hydrolytic polymerization of the hydrolysis polymerizable compound (ii), an image-recording matrix constituted by bond chains of an organic compound is formed and crosslinked in the coated film, whereby the recorded image is more firmly fixed.

The functional group (b) of the compound (i) is a group taking the charge of bonding the compound (i) to the compound (ii) being a matrix. This functional group may be any known functional group as long as it has properties of reacting with the alkyl group, aryl group, alkoxy group, aryloxy group, hydroxyl group resulting from the hydrolysis, or center metal atom of the compound (ii) to form a bond and can contain the functional group (a) in the same molecule. In particular, a functional group which hydrolyzes with a hydroxyl group or an alkoxy group and thereby forms a bond is preferred. Among these functional groups, a functional group selected from —OH, —$NH_2$, —NH—CO—$R^3$ and —$Si(OR^4)_3$, wherein $R^3$ and $R^4$ each represents an alkyl group or an aryl group and when $R^3$ and $R^4$ both are present in the compound having these functional groups, $R^3$ and $R^4$ may be the same or different, is suitably used in the present invention.

When the functional group (b) is —NH—CO—$R^3$ and/or —$Si(OR^4)_3$, $R^3$ and $R^4$ each is preferably an alkyl group having from 1 to 10 carbon atoms or an aryl group having from 6 to 20 carbon atoms, which may be substituted by a halogen such as chlorine, an alkoxy group such as methoxy group, or an alkoxycarbonyl group such as methoxycarbonyl group. Specific examples of —NH—CO—$R^3$ include —NH—CO—$CH_3$ and —NH—CO—$C_2H_5$. Specific examples of —$Si(OR^4)_3$ include —$Si(OCH_3)_3$ and —$Si(OC_2H_5)_3$.

The synthesis method of the compound (i) is not particularly limited, however, the compound (i) can be obtained by the radical polymerization of a monomer having the functional group (a) and a monomer having the functional group (b). The compound (i) may be a copolymer obtained by using only one monomer having the functional group (a) and only one monomer having the functional group (b), may be a copolymer obtained by using two or more monomers for both or either one of these monomers, or may be a copolymer of these monomers with other monomers.

The heat-crosslinking reaction includes epoxy crosslinking, isocyanate crosslinking and methylol crosslinking, and the crosslinking can be attained by applying heat and using a catalyst such as an acid or an organic metal.

For the "thermosetting functional group" for use in the present invention, the functional groups described, for example, in Takeshi Endo, Netsukokasei Kobunshi no Seimitsuka (*Fining of Thermosetting Polymers*), C.M.C (1986), Yuji Harasaki, Saishin Binder Gijutsu Binran (*Handbook of Latest Binder Technology*), Chap. II-I, Sogo Gijutsu Center (1985), Takayuki O'tsu, Acryl Jushi no Gosei•Sekkei to Shin-Yoto Kaihatsu (*Synthesis•Design of Acrylic Resin and Development of New Usage*), Chubu Keiei Kaihatsu Center Shuppan Bu (1985), and Eizo Omori, Kinousei Acryl-Kei Jushi (*Functional Acrylic Resin*), Technosystem (1985), can be used.

Examples thereof include —COOH group, —$PO_3H_2$ group, —$SO_2H$ group, —OH group, —SH group, —$NH_2$ group, —$NHR^{12}$ group {wherein $R^{12}$ represents a hydrocarbon group, for example, an alkyl group having from 1 to 8 carbon atoms (e.g., methyl, ethyl, propyl, butyl, hexyl, octyl, 2-chloroethyl, 2-methoxyethyl, 2-cyanoethyl)}, a cyclic acid anhydride-containing group, —N=C=O group, a blocked isocyanate group, —$CONHCH_2OR^{13}$ wherein $R^{13}$ represents hydrogen atom or an alkyl group having from 1 to 8 carbon atoms (specific examples are the same as those of the alkyl group represented by $R^{12}$), an epoxy group, an isocyanate group, a methylol group,

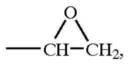 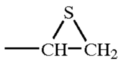 and 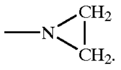

The cyclic acid anhydride-containing group is a group containing at least one cyclic acid anhydride. Examples of the cyclic acid anhydride contained include aliphatic dicarboxylic acid anhydrides and aromatic dicarboxylic acid anhydrides.

Examples of the aliphatic dicarboxylic acid anhydride include a succinic anhydride ring, a glutaconic anhydride ring, maleic anhydride ring, a cyclopentane-1,2-dicarboxylic anhydride ring, a cyclohexane-1,2-dicarboxylic anhydride ring, a cyclohexene-1,2-dicarboxylic anhydride ring and a 2,3-bicyclo[2.2.2]octanedicarboxylic anhydride ring. These rings each may be substituted, for example, by a halogen atom such as chlorine atom and bromine atom, or an alkyl group such as methyl group, ethyl group, butyl group and hexyl group.

Examples of the aromatic dicarboxylic annhydride include a phthalic anhydride ring, a naphthalene-dicarboxylic anhydride ring, a pyridine-dicarboxylic anhydride ring and a thiophene-dicarboxylic anhydride. These rings each may be substituted, for example, by a halogen atom such as chlorine atom and bromine atom, an alkyl group such as methyl group, ethyl group, propyl group and butyl group, a hydroxyl group, a cyano group, a nitro group or an alkoxycarbonyl group (the alkoxy group is, for example, a methoxy group or an ethoxy group).

Examples of the blocked isocyanate group include an adduct of an isocyanate group and an active hydrogen compound which is a functional group capable of decomposing with heat to thereby produce an isocyanate group. Examples of the active hydrogen compound include 2,2,2-trifluoroethanol, 2,2,2,2',2',2'-hexafluoroisopropylalcohol phenols (e.g., phenol, chlorophenol, cyanophenol, cresol, methoxyphenol) active methylene compounds (e.g., acetylacetone, acetoacetic acid esters, malonic acid diesters, malondinitrile) and cyclic nitrogen atom-containing compounds (e.g., imidazole, piperazine, morpholine).

Examples of the polymer obtained by a sol-gel crosslinking or heat-crosslinking are set forth below.

KP-14

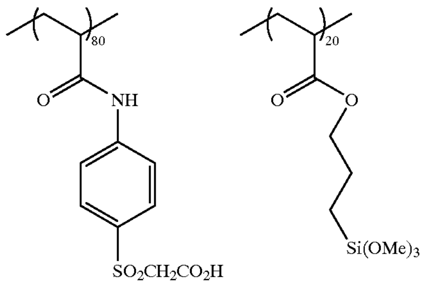

-continued

KP-15

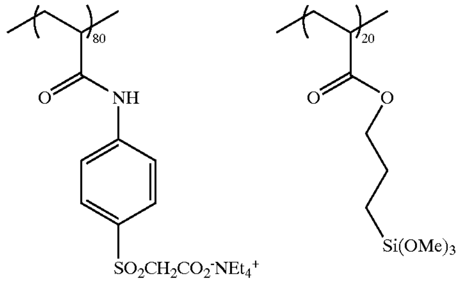

KP-16

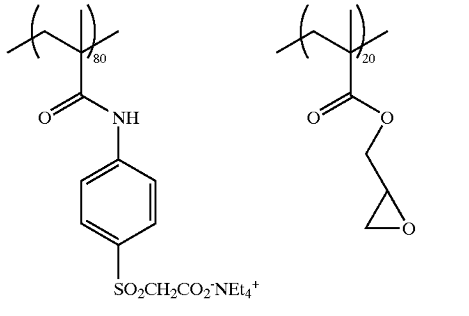

The method of preparing the polymer according to a sol-gel reaction may be any known methods such as those disclosed in "Zorugeruhou no Kagaku (Science of Sol-gel Method)" published by Agune Syouhuusya. Preferred method thereof comprises adding a reaction catalyst such as acid (e.g., hydrochloric acid, phosphoric acid, sulfuric acid, and acetic acid, particularly hydrochloric acid and phosphoric acid) or alkali (e.g., ammonia water) to an alcohol solution (preferably methanol or ethanol solution) of the compound (I) and the compound represented by formula (9), stirring the resulting solution under a reflux at 0 to 100° C., more preferably 10 to 80° C. for 15 minutes to 6 hours, preferably from 30 minutes to 5 hours to effect hydrolysis condensation. Thus, a prepolymer can be synthesized. The prepolymer is coated and dried to obtain a polymer crosslinked by a sol-gel reaction. The drying condition is generally from 30 to 200° C., preferably from 50 to 150 for 1 minute to 1 hour, preferably from 1 minute to 30 minutes.

The method of preparing the polymer according to a heat crosslinking reaction may be any known methods. For example, a heat crosslinking such as an epoxy crosslinking, an isocyanate crosslinking, and a methylol crosslinking can be effected using a catalyst such as an acid and an organic metal, and coating and drying step are efffected. Thus, a polymer crosslinked with heat can be prepared. The drying condition is generally from 30 to 200° C., preferably from 50 to 150° C., generally for 3 minutes to 1 hour, preferably from 5 to 30 minutes.

Light-heat Converting Agent

The image-forming layer of the heat-sensitive lithographic printing plate of the present invention, if adapted for laser exposure for the formation of image, preferably comprises a light-heat converting agent incorporated therein. The light to be used in the laser exposure is preferably infrared ray. In this case, an infrared absorbent is used as light-heat converting agent.

The infrared absorbent which is preferably used in the present invention is a dye or pigment which absorbs infrared rays having a wavelength of from 760 nm to 1,200 nm, more preferably a dye or pigment which has a maximum absorption at a wavelength of from 760 nm to 1,200 nm.

As the foregoing dye there may be used a commercially available dye or a known dye described in references (e.g., "Senryobinran (Handbook of Dyes)", The Society of Synthetic Organic Chemistry, Japan, 1970). Specific examples of these dyes include azo dye, metal complex azo dye, pyrazolone azo dye, anthraquinone dye, phthalocyanine dye, carbonium dye, quinonimine dye, methine dye, cyanine dye, and metal thiolate complex.

Preferred examples of these dyes include cyanine dyes as described in JP-A-58-125246, JP-A-59-84356, JP-A-59-202829 and JP-A-60-78787, methine dyes as described in JP-A-58-173696, JP-A-58-181690 and JP-A-58-194595, naphthoquinone dyes as described in JP-A-58-112793, JP-A-58-224793, JP-A-59-48187, JP-A-59-73996, JP-A-60-52940 and JP-A-60-63744, squarylium dyes as described in JP-A-58-112792, and cyanine dyes as described in British Patent 434,875.

Further, near infrared absorption sensitizers as described in U.S. Pat. No. 5,156,938 can be preferably used. Moreover, arylbenzo(thio) pyrylium salts as described in U.S. Pat. No. 3,881,924, trimethinethiapyrylium salts as described in JP-A-57-142645 (corresponding to U.S. Pat. No. 4,327,169), pyrylium compounds as described in JP-A-58-181051, JP-A-58-220143, JP-A-59-41363, JP-A-59-84248, JP-A-59-84249, JP-A-59-146063 and JP-A-59-146061, cyanine dyes as described in JP-A-59-216146, pentamethine thiopyrylium salts as described in U.S. Pat. No. 4,283,475, and pyrylium compounds as described in JP-B-5-13514 and JP-B-5-19702 may be preferably used.

Further examples of the dye include near infrared absorption dyes represented by the general formulae (I) and (II) described in U.S. Pat. No. 4,756,993.

Particularly preferred among these dyes are cyanine dye, squarylium dye, pyrylium salt, and nickel thiolate complex.

Examples of the pigment to be used in the present invention employable herein include commercially available pigments and pigments described in "Handbook of Color Index (C. I.)", "Saishin Ganryobinran (Handbook of Modern Pigments)", The Society of Pigment Technology of Japan, 1977, "Saishin Ganryou Ouyougijyutu (Applied Technique of Modern Pigments)", CMC, 1986, and "Insatsuinki Gijyutu (Printing Ink Technique)", CMC, 1984.

Examples of the kind of pigment to be used herein include black pigment, yellow pigment, orange pigment, brown pigment, red pigment, purple pigment, blue pigment, green pigment, fluorescent pigment, metal powder pigment, and polymer-bound dye. Specific examples of these pigments include insoluble azo pigment, azo lake pigment, condensed azo pigment, chelate azo pigment, phthalocyanine pigment, anthraquinone pigment, perylene pigment, perinone pigment, thioindigo pigment, quinacridone pigment, dioxazine pigment, isoindolinone pigment, quinophthalone pigment, dyed lake pigment, azine pigment, nitroso pigment, nitro pigment, natural pigment, fluorescent pigment, inorganic pigment, and carbon black. Preferred among these pigments is carbon black.

These pigments may or may not be subjected to surface treatment before use. Examples of a method for the surface treatment include a method which comprises coating the surface of a pigment with a resin or wax, a method which comprises attaching a surface active agent to the pigment, and a method which comprises bonding a reactive material (e.g., silane coupling agent, epoxy compound, polyisocyanate) to the surface of the pigment. For the details of these surface treatment methods, reference can be made to "Kinzokusekken no Seisitsu to Ouyo (Characteristics and Application of Metal Soap)", Saiwai Shobo, "Saishin Ganryou Ouyougijyutu (Applied Technique of Modern Pigments)", CMC, 1986, and "Insatsuinki Gijyutu (Printing Ink Technique)", CMC, 1984.

The particle diameter of these pigments is preferably from 0.01 μm to 10 μm, more preferably from 0.05 μm to 1 μm, particularly from 0.1 μm to 1 μm. If the particle diameter of these pigments falls below 0.01 μm, it is disadvantageous in respect to the stability of the dispersion in the coating solution of heat-sensitive composition. On the contrary, if the particle diameter of these pigments exceeds 10 μm, it is disadvantageous in respect to the uniformity of the image-forming layer thus formed.

As the method for dispersing the pigment there can be used a known dispersion technique for use in the production of ink or toner. Examples of the dispersing machine to be used in this technique include ultrasonic dispersing machine, sand mill, attritor, pearl mill, super mill, ball mill, impeller, disperser, KD mill, colloid mill, dynatron, three-roll mill, and pressure kneader. For the details of these dispersing machines, reference can be made to "Saishin Ganryou Ouyougijyutu (Applied Technique of Modern Pigments)", CMC, 1986.

The light-heat converting agent such as the above-described dyes or pigments can be incorporated in an amount of from 0.01 to 50% by weight, preferably from 0.1 to 10% by weight, particularly from 0.5 to 10% by weight for dye or from 1.0 to 10% by weight for pigment, based on the total solid content of the composition of the image-forming layer of the heat-sensitive lithographic printing plate. If the added amount of the pigment or dye falls below 0.01% by weight, the resulting sensitivity is lowered. On the contrary, if the added amount of the pigment or dye exceeds 50% by weight, the resulting non-image area can be easily stained during printing.

Other Components

The foregoing components may be used as necessary in the present invention. If necessary, the composition of the present invention may further comprise other various compounds incorporated therein.

For example, a dye which has a great absorption in the visible range may be used as an image coloring agent.

Specific examples of such a dye include Oil Yellow #101, Oil Yellow #103, Oil Pink #312, Oil Green BG, Oil Blue BOS, Oil Blue #603, Oil Black BY, Oil Black BS, Oil Black T-505 (produced by Orient Chemical Industries Limited), Victoria Pure Blue, Crystal Violet (CI42555), Methyl Violet (CI42535), Ethyl Violet, Rhodamine B (CI145170B), Malachite Green (CI42000), Methylene Blue (CI52015), and dyes described in JP-A-62-293247 and Japanese Patent Application No. 7-335145.

The added amount of such a dye is from 0.01 to 10% by weight based on the total solid content of the image-forming layer of the heat-sensitive lithographic printing plate.

The image-forming layer of the radiation-sensitive lithographic printing plate of the present invention may comprise a nonionic surface active agent as described in JP-A-62-251740 and JP-A-3-208514 or an amphoteric surface active agent as described in JP-A-59-121044 and JP-A-4-13149 incorporated therein to enhance its stability to printing conditions.

Specific examples of the nonionic surface active agent employable herein include sorbitan tristearate, sorbitan monopalmitate, sorbitan trioleate, monoglyceride stearate, and polyoxyethylene nonyl phenyl ether.

Specific examples of the amphoteric surface active agent employable herein include alkyl di(aminoethyl)glycine, alkyl polyaminoethylglycine hydrochloride, 2-alkyl-N-carboxyethyl-N-hydroxyethylimidazolinium betaine, and N-tetradecyl-N,N-betaine (e.g., Amogen K, produced by Dai-ichi Kogyo Seiyaku Co., Ltd.).

The proportion of the foregoing nonionic surface active agent and amphoteric surface active agent in the total solid content of the image-forming layer is preferably from 0.05 to 15% by weight, more preferably from 0.1 to 5% by weight.

The image-forming layer of the heat-sensitive lithographic printing plate of the present invention may further comprise a plasticizer incorporated therein as necessary to provide the coat layer with flexibility or the like. Examples of the plasticizer employable herein include polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomer and polymer of acrylic acid or methacrylic acid.

The image-forming layer of the heat-sensitive lithographic printing plate of the present invention can be normally prepared by a process which comprises dissolving the foregoing components in a solvent, and then applying the solution to a proper support. Examples of the solvent employable herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, and water. However, the present invention should not be construed as being limited to these solvents.

These solvents may be used singly or in admixture. The concentration of the foregoing components (total solid content including additives) in the foregoing solvent is preferably from 1 to 50% by weight. The coated amount of the coating compound (solid content) on the support is preferably from 0.5 to 5.0 $g/m^2$ as calculated in terms of dried amount. As the method for coating the coating compound there may be used any method. In practice, however, bar coating method, rotary coating method, spray coating method, curtain coating method, dip coating method, air knife coating method, blade coating method, roll coating method or the like can be used.

The image-forming layer of the heat-sensitive lithographic printing plate of the present invention may comprise a surface active agent for improving the coatability thereof, e.g., fluorine-based surface active agent as described in JP-A-62-170950, incorporated therein. The amount of such a surface active agent to be incorporated in the image-forming layer is preferably from 0.01 to 1% by weight, more preferably from 0.05 to 0.5% by weight.

The support (substrate) to be used in the lithographic printing plate precursor to which the foregoing image-forming material of the present invention is applied is a dimensionally stable plate material. As such a material there may be preferably used one which has heretofore been used as a support of printing plate. Examples of such a support include paper, paper laminated with a plastics (e.g., polyethylene, polypropylene, polystyrene), aluminum (including aluminum alloy), plate of a metal such as zinc, iron and copper, film of a plastic such as cellulose diacetate, cellulose triacetate, cellulose propionate, cellulose butyrate, cellulose acetobutyrate, cellulose nitrate, polyethylene terephthalate, polyethylene, polystyrene, polypropylene, polycarbonate and polyvinyl acetal, and paper or plastics laminated or metallized with such a metal. Particularly preferred among these support materials is aluminum plate. The aluminum plate may be made of pure aluminum or aluminum alloy. As the aluminum alloy there may be used any aluminum alloy. For example, an alloy of aluminum with a metal such as silicon, copper, manganese, magnesium, chromium, zinc, lead, bismuth and nickel can be used. Such a composition may contain some amount of iron and titanium or a negligible amount of impurities.

Organic Subbing Layer

The heat-sensitive lithographic printing plate is preferably coated with an organic subbing layer before being coated with the image-forming layer to minimize the remaining of the image-forming layer on the non-image area after plate making. Examples of the organic compound to be incorporated in the organic subbing layer include carboxymethylcellulose, dextrin, gum arabic, phosphonic acids having amino group such as 2-aminoethylphosphonic acid, organic phosphonic acids such as phenylphosphonic acid, naphthylphosphonic acid,. alkylphosphonic acid, glycerophosphonic acid, methylenediphosphonic acid and ethylenediphosphonic acid which may have substituents, organic phosphoric acids such as phenylphosphoric acid, naphthylphosphoric acid, alkylphosphoric acid and glycerophosphoric acid which may have substituents, organic phosphinic acids such as phenylphosphinic acid, naphthylphosphinic acid, alkylphosphinic acid and glycerophosphinic acid which may have substituents, amino acids such as glycine and b-alanine, and amine hydrochlorides having hydroxyl group such as triethanolamine hydrochloride. These organic compounds may be used singly or in admixture.

Besides these organic compounds, high molecular compounds having a structural unit such as poly(p-vinylbenzoic acid) may be used.

The foregoing organic subbing layer can be provided by the following methods. In some detail, a solution obtained by dissolving the foregoing organic compound in water, an organic solvent such as methanol, ethanol and methyl ethyl ketone, or in a mixture thereof, may be applied to a support, and then dried. An alternative method comprises dipping a support in a solution obtained by dissolving the foregoing organic compound in water, an organic solvent such as methanol, ethanol and methyl ethyl ketone, or in a mixture thereof, so that the organic compound is adsorbed by the support, washing the support, and then drying the support to provide an organic subbing layer thereon. In accordance with the former method, a solution of the foregoing organic compound generally having a concentration of from 0.005 to 10% by weight can be applied to the support by various methods. For example, any of bar coating method, rotary coating method, spray coating method, curtain coating method, etc. can be used. In accordance with the latter method, the concentration of the coating solution is generally from 0.01 to 20% by weight, preferably from 0.05 to 5% by weight, the dipping temperature is generally from 20° C. to 90° C., preferably from 25° C. to 50° C., and the dipping time is generally from 0.1 seconds to 20 minutes, preferably from 2 seconds to 1 minute.

The coating solution employable herein may be adjusted with a basic substance such as ammonia, triethylamine and potassium hydroxide or an acidic substance such as hydrochloric acid and phosphoric acid to a pH value of from 1 to 12 before use. The coating solution may comprise a yellow dye incorporated therein to improve the tone reproducibility of the heat-sensitive lithographic printing plate.

The coated amount of the organic subbing layer is preferably from 2 to 200 mg/m$^2$, more preferably from 5 to 100 mg/m$^2$ as calculated in terms of dried amount. If the coated amount of the organic subbing layer falls below 2 mg/m$^2$, a sufficient press life cannot be obtained. On the contrary, if the coated amount of the organic subbing layer exceeds 200 mg/m$^2$, the same disadvantage occurs.

For the purpose of improving the adhesion to the image-forming layer, a compound obtained by the hydrolysis and polycondensation reaction of a silane coupling agent having at least one addition polymerizable functional group performed in the presence of an organic sulfonic acid represented by the following formula (I) as a catalyst can be coated on the surface of an aluminum support to form an organic undercoat layer:

$$RSO_3H \quad (I)$$

wherein R represents an organic group having from 2 to 50 carbon atoms.

The compound obtained by the hydrolytic polycondensation reaction of a silane coupling agent having at least one addition polymerizable functional group performed in the presence of the above-described organic sulfonic acid as a catalyst is an organic-inorganic composite where an addition reactive functional group is fixed to an inorganic polymer containing —Si—O—Si— bond.

In the present invention, for providing an adhesive layer on the surface of a support, a so-called sol-gel process (hereinafter referred to as "SG process") using the above-described organic-inorganic composite can be applied. The SG process is described in Toshio Imai, Yuki Keiso Polymer no Saishin Gijutsu•Dai 6 Sho Sol-Gel Ho to Keiso-Kei Kobunshi no Kenkyu Doukou (*Latest Technology of Organic Silicon Polymers*—Chap. 6: Study and Tendency of Sol-Gel Process and Silicon-Base Polymers), CMC (1996), and Sumio Sakka, So-Gel Hou no Kagaku (*Process of Sol-Gel Process*)", Agune Syouhuusya (1988), however, the present invention is by no means limited thereto.

When this organic-inorganic composite is coated on a support as an adhesive layer and then dried, the inorganic polymer part closely adheres to the support, whereas the addition reactive functional group remains as it is on the support surface.

The addition reactive functional group may also be coated on a support by performing the hydrolytic polycondensation reaction of a silane coupling agent in a solution such as an alcohol containing a slight amount of water, in the presence of a catalyst according to the SG process to prepare a liquid composition containing an inorganic molecule having a high molecular weight, coating the composition as an adhesive layer on the support surface and then, if desired, drying it.

The SG process is advantageous in that the distribution of addition reactive functional groups bonded and fixed on the support surface is scarcely affected by the distribution of chemical properties of the support surface, such as acid point and base point.

Examples of the silane coupling agent for use in the present invention include the compound represented by the following formula (II):

$$Ra(Rb)SiRc(Rd) \quad (II)$$

(wherein at least two of Ra to Rd are an alkoxy group having 10 or less carbon atoms or —OCOR' and the remainders each represents an addition polymerizable reacting group; and R' represents an alkyl group).

Examples of the alkyl group represented by R' in formula (II) include a methyl group, an ethyl group and a propyl group, and examples of the addition polymerizable reacting group include an alkenyl group and an alkynyl group. Between the Si atom and the addition polymerizable reacting group, a linking group of various types may be bonded. Examples of the alkenyl group include a vinyl group, a propenyl group, an allyl group, a butenyl group and a dialkylmaleimide group, and examples of the alkynyl group include an acetylene group and an alkylacetylene group.

Examples of the silane coupling agent include those described in Edwin P. Pleuddemann, *Silane Coupling Agent*, Plenum Press (1982).

Specific examples thereof include tetramethoxysilane, tetraethoxysilane, tetraisopropoxysilane, tetra(n-propoxy)-silane, tetra(n-butoxy)silane, tetrakis(2-ethylbutoxy)silane, tetrakis(2-ethylhexyloxy)silane, tetrakis(2-methoxyethoxy) silane, tetraphenoxysilane and tetraacetoxy-silane. Among these, tetraethoxysilane is preferred.

Specific examples of the silane coupling agent having an addition polymerizable, ethylenic double bond reacting group are set forth below, however, the present invention is by no means limited thereto.

$CH_2{=}CH{-}Si(OCOCH_3)_3$, $CH_2{=}CH{-}Si(OC_2H_5)_3$, $CH_2{=}CH{-}Si(OCH_3)_3$, $CH_2{=}CHCH_2{-}Si(OC_2H_5)_3$, $CH_2{=}CHCH_2NH(CH_2)_3{-}Si(OCH_3)_3$, $CH_2{=}CHCOO{-}(CH_2)_3{-}Si(OCH_3)_3$, $CH_2{=}CHCOO{-}(CH_2)_3{-}Si(OC_2H_5)_3$, $CH_2{=}CHCOO{-}(CH_2)_4{-}Si(OCH_3)_3$, $CH_2{=}C(CH_3)COO{-}(CH_2)_3{-}Si(OCH_3)_3$, $CH_2{=}C(CH_3)COO{-}(CH_2)_3{-}Si(OC_2H_5)_3$, $CH_2{=}C(CH_3)COO{-}(CH_2)_4{-}Si(OCH_3)_3$, $CH_2{=}C(CH_3)COO{-}(CH_2)_5{-}Si(OHC_3)_3$, $(CH_2{=}C(CH_3)COO{-}(CH_2)_3)_2{-}Si(OCH_3)_2$, $CH_2{=}C(CH{=}CH_2){-}Si(OCH_3)_3$, $CH_2{=}CH{-}SO_2NH{-}(CH_2)_3{-}Si(OCH_3)_3$, $CH_2{=}CH{-}ph{-}O{-}Si(OCH_3)_3$, (wherein ph represents a benzene ring)

$CH_2{=}CH{-}ph{-}CONH{-}(CH_2)_3{-}Si(OCH_3)_3$, $CH_2{=}CH{-}ph{-}CH_2NH{-}(CH_2)_3{-}Si(OCH_3)_3$, $CH_2{=}CH{-}ph{-}CH_2NH{-}C_2H_4NH(CH_2)_3{-}S$ $i(OCH_3)_3$,.HCl $HC{\equiv}C{-}Si(OC_2H_5)_3$, $CH_3C{\equiv}C{-}Si(OC_2H_5)_3$, $DMI{-}(CH_2)_mOCONH{-}(CH_2)_3{-}Si(OCH_3)_3$, (wherein DMI represents a dimethylmaleimide group and m is a number of from 1 to 20)

$CH_2{=}CHCH_2O{-}Si(OCH_3)_3$, $(CH_2{=}CHCH_2O)_4Si$, $HO{-}CH_2{-}C{\equiv}C{-}Si(OC_2H_5)_3$, $CH_3CH_2CO{-}C{\equiv}C{-}Si(OC_2H_5)_3$, $CH_2{=}CHS{-}(CH_2)_3{-}Si(OCH_3)_3$, $CH_2{=}CHCH_2O{-}(CH_2)_2{-}SCH_2{-}Si(OCH_3)_3$, $CH_2{=}CHCH_2S{-}(CH_2)_3{-}S{-}Si(OCH_3)_3$, $(CH_3)_3CCO{-}C{\equiv}C{-}Si(OC_2H_5)_3$, $(CH_2{=}CH)_2N{-}(CH_2)_2{-}SCH_2{-}Si(OCH_3)_3$, $CH_3COCH{=}C(CH_3){-}O{-}Si(OCH_3)_3$ Some compounds of these silane coupling agents may be mixed at an arbitrary ratio.

At the time of coating an adhesive layer containing the compound obtained by the SG reaction of the silane coupling agent on a support, the above-described silane coupling agents may be used either individually or in combination or may be used after diluting it with an appropriate solvent. Examples of the solvent include methanol, ethanol, propanol, isopropanol, ethylene glycol, hexylene glycol, THF and DMF. Among these, alcoholsarepreferred. These organic solvents may also be used in combination of two or more thereof.

The amount of the solvent used is generally 0.2 to 500 times, preferably from 0.5 to 100 times, more preferably from 1 to 20 times, based on the total weight of the silane coupling agent used. If the amount used is less than 0.2 times, the reaction solution is disadvantageously unstable and readily gels with the elapse of time, whereas if it exceeds 500 times, the reaction takes several days and this is not preferred.

In the present invention, water may also be used so as to accelerate the hydrolysis reaction. The amount of water added for the hydrolysis of the silane coupling agent is generally from 0.1 to 1,000 mol, preferably from 0.5 to 200 mol, more preferably from 1.5 to 100 mol, per mol of the compound. If the amount of water is less than 0.1 mol per mol of the compound, the hydrolysis and the subsequent polycondensation reaction proceed slowly and several days are necessary for reaching a stable surface treatment, whereas if the amount of water exceeds 1,000 mol per mol of the compound, adhesion failure may occur when the composition produced is coated on a metal surface, or the composition deteriorates in the aging stability and readily gels, as a result, the coating work cannot be performed stably.

The temperature used for preparing a composition suitable for the SG process is from room temperature to about 100° C. The reaction may also be performed at a temperature higher than the boiling point of the solvent and in this case, if desired, a reflux condenser is preferably equipped to the reactor.

Backcoat

The support may be provided with a backcoat on the other surface thereof as necessary. As such a backcoat there may be preferably used a coat layer made of a metal oxide obtained by the hydrolysis and polycondensation of an organic high molecular compound as described in JP-A-5-45885 with an organic or inorganic metal compound as described in JP-A-6-35174.

Particularly preferred among these coat layers are those made of metal oxides obtained from alkoxy compounds of silicon such as $Si(OCH_3)_4$, $Si(OC_2H_5)_4$, $Si(OC_3H_7)_4$ and $Si(OC_4H_9)_4$, which are inexpensive and easily available. These coat layers are excellent in hydrophilicity.

In this manner, the heat-sensitive lithographic printing plate of the present invention can be prepared. The heat-sensitive lithographic printing plate thus-prepared can be directly subjected to imagewise thermal recording by a thermal recording head or the like or can be imagewise exposed to light from a solid laser or semiconductor laser emitting an infrared ray having a wavelength of from 760 nm to 1,200 nm. In the present invention, the heat-sensitive lithographic printing plate which has thus been subjected to thermal recording or irradiation with laser beam is subjected to aqueous development, optionally followed by gumming, and then mounted on the printing machine for printing. Alternatively, the heat-sensitive lithographic printing plate which has thus been subjected to thermal recording or irradiation with laser beam may be immediately mounted on the printing machine for printing. In practice, however, the heat-sensitive lithographic printing plate which has thus been subjected to thermal recording or irradiation with laser beam is preferably subjected to heat treatment. The heat treatment is preferably effected at a temperature of from 80° C. to 150° C. for 10 seconds to 5 minutes. This heat treatment makes it possible to reduce the amount of heat or laser energy required for thermal recording or irradiation with laser beam.

The lithographic printing plate thus obtained is mounted on the offset printing machine after subjected to aqueous development or as it is. In this arrangement, many sheets are printed.

The present invention will be further described in the following examples, but the present invention should not be construed as being limited thereto.

EXAMPLES 1 TO 4

Preparation of Support

Production of Support through Sol-Gel Process:

The surface of a 0.30 mm-thick aluminum plate was grained using a nylon brush and a water suspension of 400-mesh pumice stone and then thoroughly washed with water. Subsequently, the aluminum plate was etched by dipping it in a 10 wt % aqueous solution of sodium hydroxide at 70° C. for 60 seconds, washed with running water, washed for neutralization with a 20 wt % nitric acid, and then washed with water. The aluminum plate obtained was subjected to an electrolytic surface-roughening treatment in a 1 wt % aqueous solution of nitric acid using sine wave a.c. waveform current under the condition of $V_A$=12.7 V at an electricity of 160 coulomb/$dm^2$ at the anode. The surface roughness was measured and found to be 0.6 μm (Ra indication) Subsequently, the aluminum plate was immersed in 30 wt % aqueous solution of sulfuric acid and desmutted at 55° C. for 2 minutes. Thereafter, the aluminum plate was subjected to an anodization treatment in 20 wt % aqueous solution of sulfuric acid at a current density of 2 A/$dm^2$ for 2 minutes to form an anodic oxide layer having a thickness of 2.7 g/$dm^2$.

A liquid composition (sol solution) for SG process was prepared by the following procedure.

| Sol Solution | |
|---|---|
| Methanol | 130 g |
| Water | 20 g |
| 85 wt % Phosphoric acid | 16 g |
| Tetraethoxysilane | 50 g |
| 3-Methacryloxypropyltrimethoxysilane | 60 g |

The sol solution having the composition shown above was mixed and stirred, and as a result, heat was generated after about 5 minutes. After allowing the reaction to proceed for 60 minutes, the contents were transferred to a separate container and thereto 3,000 g of methanol was added to obtain a sol solution. This sol solution was diluted with methanol/ethylene glycol (=9/1 (by weight)) and the diluted solution was coated on a substrate to have an Si coverage of 3 mg/$m^2$ and then dried at 100° C. for 1 minute.

Preparation of Coating Solution of Image-Forming Layer

As an image-forming layer coating solution there was prepared a solution having the formulation shown in Table 1 below.

TABLE 1

| Example No. | Polymer used | Monomer added | Sensitizer (polymerization initiator) | Photo-heat converting material | Coating Solvent |
|---|---|---|---|---|---|
| 1 | KP-8 0.4 g | None | General formula (I) 0.04 g | IR125 0.04 g | MEK 1.6 g |
| 2 | KP-5 0.4 g | None | General formula (I) 0.04 g | IR125 0.04 g | MEK 1.6 g |
| 3 | KP-1 0.4 g | ATMMT 0.2 g | DMAB 0.04 g | IR125 0.04 g | MEK 1.6 g |
| 4 | KP-4 0.4 g | ATMMT 0.2 g | DMAB 0.04 g | IR125 0.04 g | MEK 1.6 g |

(Note)
MEK: Methyl ethyl ketone
ATMMT: Pentaerythritol tetraacrylate
DMAB: 4,4'-Dimethylaminobenzophenone
IR125: produced by Wako Pure Chemical Industries, Ltd.

(I)

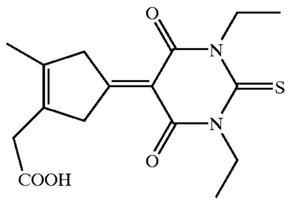

The solution thus prepared was applied to the support thus prepared, and then dried at a temperature of 80° C. for 1 minute. Subsequently, the coated material was exposed to ultraviolet rays using a metal halide at 1,000 counts to obtain a lithographic printing plate precursor having a photo-crosslinked image-forming layer formed thereon.

Printing Test

The lithographic printing plate precursor thus obtained was then imagewise exposed to light from YAG laser emitting infrared rays having a wavelength of 1,064 nm. The lithographic printing plate thus exposed was then subjected to printing test using Hider SOR-M to evaluate stainability.

None of these examples suffered from stain even after 20,000 sheets of printing.

EXAMPLES 5 TO 8

A solution having the components shown in Table 2 below was prepared as a coating solution for an image-forming layer.

TABLE 2

| Example | Polymer Used | Monomer Added | Sensitizer (Polymerization Initiator) | Light-Heat Converting Material | Coating Solvent |
|---|---|---|---|---|---|
| 5 | KP-9 0.4 g | none | Formula (I) 0.04 g | Dye A 0.04 g | MeOH 1.6 g |
| 6 | KP-10 0.4 g | none | Formula (I) 0.04 g | Dye A 0.04 g | MeOH 1.6 g |
| 7 | KP-11 0.4 g | none | DMAB 0.04 g | Dye A 0.04 g | MeOH 1.6 g |
| 8 | KP-12 0.4 g | ATMMT 0.2 g | DMAB 0.04 g | Dye A 0.04 g | MeOH 1.6 g |

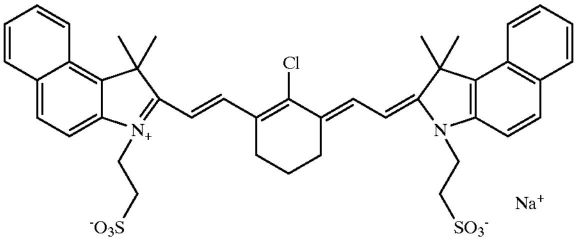

Dye A

The solution obtained was coated on a support prepared above and dried at 80° C. for 1 minute. The coating formed was subjected to UV exposure (using a metal halide lamp for 1,000 count) to obtain a lithographic printing plate precursor having a photo-crosslinked image-forming layer.

Printing Test

The lithographic printing plate precurosr obtained was imagewise exposed by a semiconductor laser capable of emitting an infrared ray having a wavelength of 830 nm. After the exposure, the lithographic printing original plate was used as it is for a printing test in HEIDEL SOR-M and evaluated on the generation of staining.

In all Examples, staining was not generated even when 20,000 sheets were printed.

As mentioned above, the present invention can provide a heat-sensitive lithographic printing plate which can be subjected to aqueous development or does not require any special treatment such as wet development and rubbing after image writing. In particular, the present invention can provide a heat-sensitive lithographic printing plate which can be subjected to recording by a solid laser or semiconductor laser emitting infrared rays to allow direct plate making from digital data.

The present invention can further provide a heat-sensitive lithographic printing plate excellent in press life.

While the invention has been described in detail and with reference to specific embodiments thereof, it will be apparent to one skilled in the art that various changes and modifications can be made therein without departing from the spirit and scope thereof.

What is claimed is:

1. A heat-sensitive lithographic printing plate comprising a support, an organic subbing layer and an image-forming layer containing a crosslinked polymer that is crosslinked by a photo-crosslinking reaction by photodimerization or photoradical polymerization and which changes from hydrophobic to hydrophilic by heat wherein the polymer comprises a side chain having a group which changes from hydrophobic to hydrophilic when acted upon by heat, said group selected from the group consisting of sulfonic acid ester group, disulfonic group, sulfonimide group and alkoxyalkyl ester group, wherein the organic subbing layer is provided between the support and the image-forming layer, the organic subbing layer comprising an organic-inorganic composite comprising an addition reactive functional group and an inorganic polymer comprising —Si—O—Si— bonds, with the inorganic polymer being closely adhered to the support.

2. The heat-sensitive lithographic printing plate according to claim 1, wherein the subbing layer is formed by the steps of: preparing the organic-inorganic composite by a hydrolytic polycondensation reaction of a silane coupling agent having at least one addition polymerizable functional group; coating the organic-inorganic composite on the support; and drying the coating.

* * * * *